(12) United States Patent
Zhou

(10) Patent No.: US 7,403,068 B2
(45) Date of Patent: Jul. 22, 2008

(54) METHOD FOR DOUBLE SAMPLING LOOP NEGATIVE FEEDBACK AND DOUBLE SAMPLING NEGATIVE FEEDBACK AMPLIFIER

(76) Inventor: Zongshan Zhou, Room 704, C Stair, No. 66, Yandu Road, Tianhe District, Guangzhou, Guangdong, 510507 (CN)

( * ) Notice: Subject to any disclaimer, the term of this patent is extended or adjusted under 35 U.S.C. 154(b) by 0 days.

(21) Appl. No.: 11/574,383
(22) PCT Filed: Aug. 10, 2005
(86) PCT No.: PCT/CN2005/001223

§ 371 (c)(1),
(2), (4) Date: Sep. 14, 2007

(87) PCT Pub. No.: WO2006/021142

PCT Pub. Date: Mar. 2, 2006

(65) Prior Publication Data

US 2007/0296502 A1 Dec. 27, 2007

(30) Foreign Application Priority Data

Aug. 27, 2004 (CN) .................. 2004 1 0051246

(51) Int. Cl.
*H03F 1/36* (2006.01)
(52) U.S. Cl. .................. 330/103; 330/107; 330/109
(58) Field of Classification Search ................ 330/103, 330/107, 109
See application file for complete search history.

(56) References Cited

U.S. PATENT DOCUMENTS

| 3,813,609 | A | * | 5/1974 | Wilkes et al. | .................. 330/51 |
| 4,481,479 | A |   | 11/1984 | Gehring | |
| 4,634,993 | A | * | 1/1987 | Koen | .................. 330/253 |
| 5,623,226 | A |   | 4/1997 | Whitmarsh et al. | |
| 5,974,089 | A | * | 10/1999 | Tripathi et al. | .................. 375/247 |
| 6,081,158 | A | * | 6/2000 | Twitchell et al. | .................. 330/149 |
| 6,417,504 | B1 | * | 7/2002 | Kozlowski | .................. 250/214 R |

FOREIGN PATENT DOCUMENTS

CN 2388776 Y 7/2000

* cited by examiner

*Primary Examiner*—Patricia Nguyen
(74) *Attorney, Agent, or Firm*—Kening Li

(57) ABSTRACT

A method for double sampling loop negative feedback comprising: obtaining a low-frequency feedback signal from the output of the amplifier; obtaining a high-frequency feedback signal from part of the amplifier of which high-frequency phase shift is low, wherein two-ways sampling signals have the same amplifying phase; combining the two-ways sampling signals together using a series capacitor-inductor double signal combining circuit to form one signal, the signal having low phase shift at both high and low-frequency and being used for negative loop feedback. The invention also provides a double negative feedback amplifier using the method.

7 Claims, 4 Drawing Sheets

METHOD FOR DOUBLE SAMPLING LOOP NEGATIVE FEEDBACK AND DOUBLE SAMPLING NEGATIVE FEEDBACK AMPLIFIER

FIELD OF THE INVENTION

The invention relates to an amplifier, and more particularly, to a method for double sampling loop negative feedback and double sampling negative feedback amplifier.

BACKGROUND OF THE INVENTION

Loop negative feedback is an important method for improving performance of a linear amplifier. For a loop negative feedback amplifier, larger loop feedback depth results in less distortion of the amplifier. However, further increase in feedback depth is limited by stability of the amplifier. That is to say, if the frequency of amplified signal is higher, the loop negative feedback depth obtainable will be smaller. More particularly, for a power amplifier, since it is necessary to utilize power elements of bad frequency characteristic, or use more stages of buffer amplifiers to provide sufficient gain and to accommodate the complex change of output load, signal of higher-frequency will achieve smaller negative feedback depth. For example, the negative feedback depth of the audio power amplifier generally is only 10 times (20 db) at a frequency of 20 KHz. Therefore, the capability of the loop negative feedback to lower amplifier distortion is limited.

There is also a need to solve the negative feedback loop stability problem of the amplifier for purpose of increasing the feedback depth of the amplifier. Instability of the loop feedback is due to: a phase shift of negative 180 degree to the closed-loop feedback at a certain frequency, thus satisfying the condition of generating a positive feedback. In addition, the closed-loop gain at the frequency is larger than 1, and oscillations are generated due to satisfaction of self-excited oscillation.

Accordingly, it is necessary to provide a method for double sampling loop negative feedback and double sampling negative feedback amplifier for overcoming disadvantages of the conventional technology.

SUMMARY OF THE INVENTION

In view of the shortcomings of the conventional technology, a main object of the invention is to provide a method for double sampling loop negative feedback, which is advantageous at least in increasing the feedback depth.

Another object of the invention is to provide a double sampling negative feedback amplifier, which has good stability and small distortion characteristics.

In order to achieve the above objects, the invention provides a method for double sampling loop negative feedback for an amplifier, which comprises the steps: obtaining a low-frequency feedback signal from the output of the amplifier; obtaining a high-frequency feedback signal from part of the amplifier of which the high frequency signal phase shift is low, wherein two-ways sampling signals have the same amplifying phase; combining the two sampling signals together using a series capacitor-inductor double signal combining circuit to form one signal, which has low phase shift at both high and low-frequency and is used for negative loop feedback. In the present invention, a damping resistor may be added to the series capacitor-inductor double signal combining circuit in parallel to the inductor or in series to the capacitor, or a damping resistor may be in parallel to the inductor and another resistor may be in series to the capacitor at a time.

The invention further provides a double sampling negative feedback amplifier, which comprises: a voltage amplifying circuit used to output voltage signal and transfer it to a high-speed buffer circuit and an output buffer circuit; an output buffer circuit used to achieve unit voltage gain and to provide amplified output signal and low-frequency feedback signal; a high-speed buffer circuit used to achieve unit voltage gain and to output high-frequency feedback signal to the input of the double signal combining circuit; a series capacitor-inductor double signal combining circuit used to combine the high and low-frequency feedback signals to form a one-way compound feedback signal; and a feedback network for transfer the compound feedback signal to the inverting input of the voltage amplifying circuit.

Accordingly to an embodiment of the invention, a damping resistor may be added to the series capacitor-inductor double signal combining circuit in parallel to the inductor or in series to the capacitor, or a damping resistor may be in parallel to the inductor and another damping resistor may be in series to the capacitor at a time.

In an embodiment, the double sampling negative feedback amplifier has a high-pass filter circuit incorporated in its high-frequency sampling channel in order to remove the low-frequency signal. In another embodiment, the double sampling negative feedback amplifier further comprises a voltage gain stage prior to the output buffer circuit. In yet another embodiment, the double sampling negative feedback amplifier further comprises a low-pass filter circuit prior to the low-frequency sampling node, which is utilized to remove the high-frequency signal from the low-frequency sampling channel.

The invention has several advantages. Firstly, as the output buffer circuit is kept away from the high-frequency feedback loop, the stability at high-frequency will not be influenced by the output buffer circuit (stage) and changeable load. While the output buffer circuit and the load often have great impact on the feedback depth, the stability is affected only at low-frequency. The stability at high-frequency is affected by the high-frequency feedback sampling. Accordingly, the feedback depth of high-frequency is enhanced, i.e., more stable feedback depth can be obtained. Secondly, because the series capacitor-inductor double signal combining circuit signal ratio changes rapidly with frequency, it can achieve deeper feedback depth with a relatively narrow bandwidth of the output buffer circuit, thus reducing difficulty in realizing of deep negative feedback.

Other aspects, features, and advantages of this invention will become apparent from the following detailed description when taken in conjunction with the accompanying drawings, which are a part of this disclosure and which illustrate, by way of example, principles of the series capacitor-inductor double signal combining circuit, and double sampling negative feedback amplifier of the invention.

DETAILED DESCRIPTION OF THE INVENTION

The invention provides a method for double sampling loop negative feedback, which includes the follow steps: obtaining a low-frequency feedback signal from the output of the amplifier; obtaining a high-frequency feedback signal from part of the amplifier where high frequency signal phase shift is low, wherein two sampling signals have the same amplifying phase; combining the two sampling signals together using a series capacitor-inductor double signal combining circuit to form one signal, the signal having low phase shift at both high and low-frequency and being used for negative loop feedback. In the present invention, a damping resistor may be added to the series capacitor-inductor double signal combining circuit in parallel to the inductor or in series to the capacitor, or a damping resistor may be in parallel to the inductor and another resistor may be in series to the capacitor at a time. In the invention, amplifying signal frequency band exists in low-frequency feedback frequency band. As the output stage and the load will have impact on the stability of the negative feedback loop only at low-frequency band, but have no impact on the stability at high-frequency band, it is enabling to improve the feedback depth.

For a double negative feedback circuit, because the feedback signal doesn't represent completely the output signal as not all the feedback signals come from the output of the amplifier, the actual effect of feedback will be degraded. Thus, it is necessary to let the combined feedback signal to improve its proportion coming from the output of the amplifier so as to make the actual feedback signal as identical to the output signal as possible. The proportion should be increased when the feedback depth is deeper. Therefore, the following two methods can be used:

The first method: increasing crossover frequency of the double sampling circuit such that the bandwidth of the amplifier output (low-frequency sampling portion) will be widened. The method requires increase of the bandwidth of the output stage.

The second method: utilizing a signal combining method which has characteristic of rapid frequency change. The method can take a lower crossover frequency, the requirement of bandwidth for the output stage is low and can obtain good stability.

The following detailed description will be illustrated taken in conjunction with the accompanying drawings, which are a part of this disclosure and which illustrate, by way of example, principles of this invention.

EMBODIMENT 1

Figure 1:
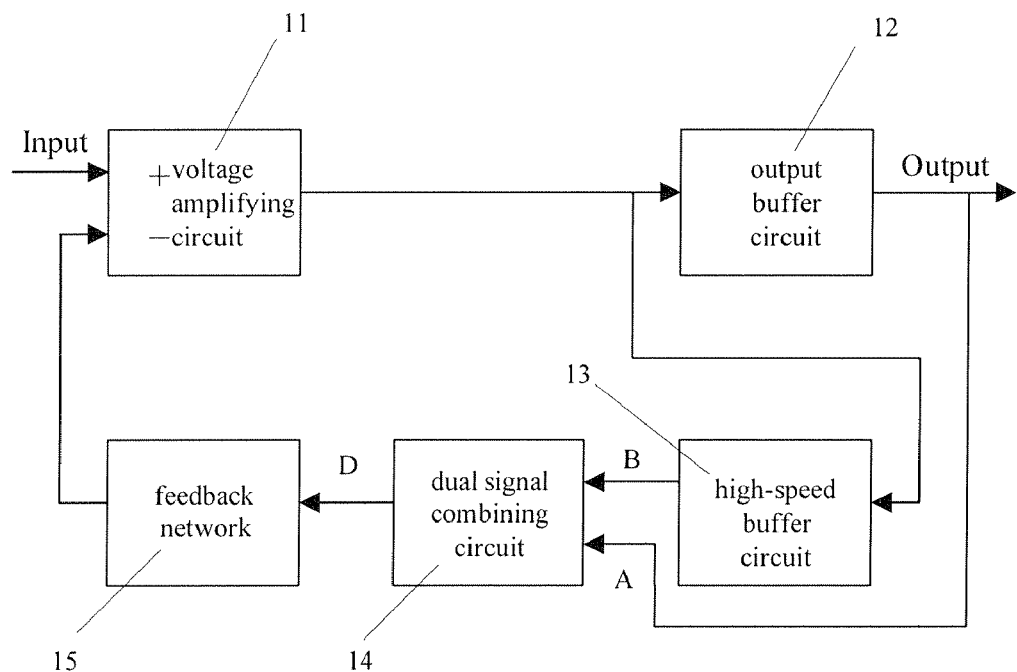
FIG. 1 shows a schematic block illustrating a circuit of a double sampling negative feedback amplifier in accordance with a first embodiment of the invention.

FIG. 1 shows a block illustrating a circuit of a double sampling negative feedback amplifier in accordance with a first embodiment of the invention. Meaning and usage of each numeral is explained as follows:

11: voltage amplifying circuit used to output voltage signal and transfer it to a high-speed buffer circuit and an output buffer circuit. In an example embodiment, the voltage amplifying circuit is a differential input voltage amplifying stage.

12: output buffer circuit used to achieve unit voltage gain, provide amplified output signal and low-frequency feedback sampling signal for a double signal combining circuit.

13: high-speed buffer circuit used to achieve high speed unit voltage gain and output high-frequency feedback sampling signal to an input of the double signal combining circuit.

14: double signal combining circuit used to combine the high and low-frequency feedback signals to form one-way compound feedback signal.

15: feedback network for transfer the compound signal to the inverting input node of the voltage amplifying circuit.

Firstly, the output signal of the voltage amplifying circuit 11 is delivered to the output buffer circuit 12 and the high-speed buffer circuit 13. The output buffer circuit 12 provides amplified output signal and low-frequency feedback sampling signal for the double signal combining circuit. The high-speed buffer circuit 13 provides high-frequency feedback sampling signal for the double signal combining circuit. The double signal combining circuit 14 composes the two-ways sampling signals into one-way signal, and then, the signal is delivered by feedback network 15 to the inverting input of the voltage amplifying circuit 11 to form a loop feedback.

Figure 2:
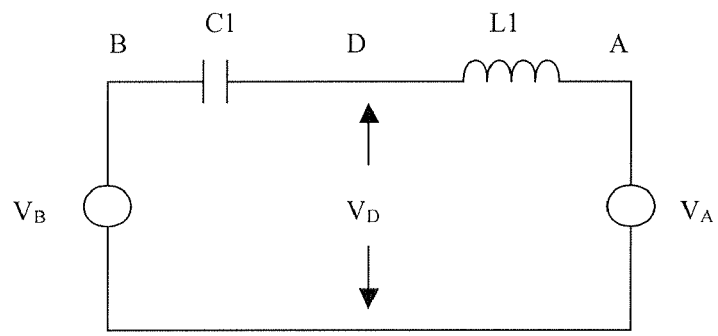
FIG. 2 shows a schematic view illustrating a series capacitor-inductor double signal combining circuits in accordance with a first embodiment of the invention.

In accordance with the invention, the main point of the design is a series capacitor-inductor double signal combining circuit. FIG. 2 shows a schematic view illustrating a series capacitor-inductor double signal combining circuit in accordance with an embodiment of the invention. The circuit is constructed by a capacitor C1 and an inductor L1 in series connection. One node A of the capacitor C1 is the high-frequency sampling input point, one node B of the inductor L1 is the low-frequency sampling input point, while the connection node D of the capacitor C1 and the inductor L1 is the compound signal output point. Nodes A, B and D shown in FIG. 2 are corresponding with the nodes A, B and D shown in FIG. 1, wherein $V_A$: Low-frequency sampling input signal at node A of FIG. 1;

$V_B$: High-frequency sampling input signal at node B of FIG. 1;

$V_D$: Compound output feedback signal at node D of FIG. 1.

In order to explain the invention more clearly, the relationship between ratio $R_{AB}$ (the combining ratio of $V_A$ and $V_B$, in compound signal $V_D$) and the frequency is analyzed. Assuming that $Z_C$, $Z_L$ are impedance of C1, L1 respectively, The component voltage $V_{DA}$ of $V_D$ generated by $V_A$ is expressed as follows:

$$V_{DA} = \frac{Z_C}{Z_C + Z_L} V_A$$

The component voltage $V_{DB}$ of $V_D$ generated by $V_B$ is expressed as follows:

$$V_{DB} = \frac{Z_L}{Z_C + Z_L} V_B$$

The ratio $R_{AB}$ ($V_{DA}/V_{DB}$) is expressed as:

$$R_{AB} = \frac{1}{C1 * L1 * \omega^2} \frac{V_A}{V_B}$$

It can be seen from the above formula that $R_{AB}$ shows the relationship between ratio of low-frequency sampling component to high-frequency sampling component against the frequency for the compound feedback signal. Because the change of the ratio is proportional to the square of the frequency change, the method of the invention gains a feature of rapid frequency change, thus can achieving deeper feedback depth using narrower bandwidth in low-frequency feedback sampling. This is an important feature of the double signal combining circuit of the invention.

If the frequency at which $R_{AB}$ equals to 1 is defined as the crossover frequency Fs of the double sampling feedback system, then $$F_s = \frac{1}{2\pi} \sqrt{\frac{1}{C1 * L1} \frac{V_A}{V_B}}$$

Figure 3:
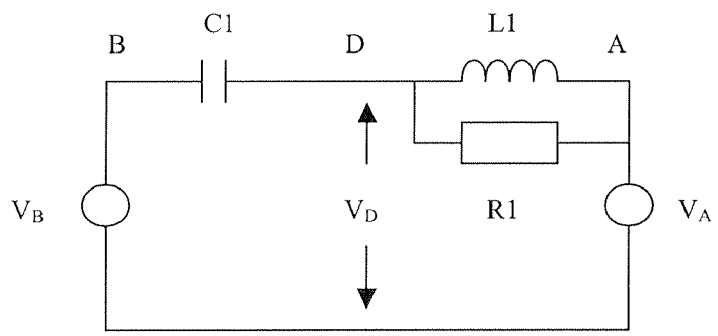
FIG. 3 shows a schematic view illustrating a series capacitor-inductor double signal combining circuits in accordance with a second embodiment of the invention.
Figure 4:
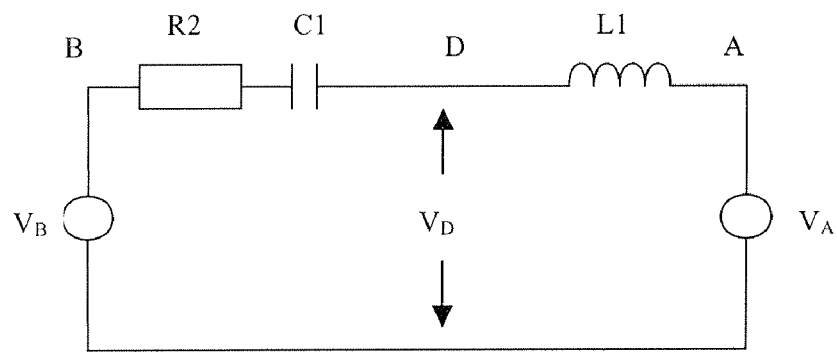
FIG. 4 shows a schematic view illustrating a series capacitor-inductor double signal combining circuits in accordance with a third embodiment of the invention.
Figure 5:
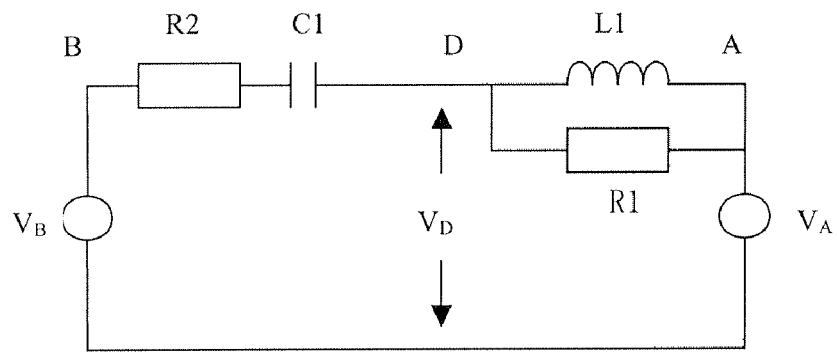
FIG. 5 shows a schematic view illustrating a series capacitor-inductor double signal combining circuits in accordance with a fourth embodiment of the invention.

Referring to FIG. 2, because the inductor L1 and the capacitor C1 are dynamic elements, the frequency characteristic of compound feedback signal at point D may have fluctuation in the band that between the high and low-sampling frequency, thus resulting in instability. In order to reduce the fluctuation, the inductor L1 may connect with a damping resistor in parallel, or the capacitor C1 may connect in series with a damping resistor. In an actual application circuit, as the damping resistor connected in series with the capacitor C1 is very small, the inner resistor of the buffer could be used as the resistor in this case. In the circuit shown in FIG. 3, a damping resistor R1 is added in parallel to the inductor L1. In the circuit shown in FIG. 4, a damping resistor R2 is added in series with the capacitor C1. In the circuit shown in FIG. 5, a damping resistor R1 in parallel to the inductor L1 and a damping resistor R2 in series with the capacitor C1 are together added therein.

Referring to FIGS. 2-5, at the amplifying signal frequency, as the impedance of the inductor L1 is very small, $V_A$, $V_B$ and $V_D$ have almost the same voltage level, and accordingly, the current passing through the capacitor C1 at the amplifying signal frequency is very small. That is, the capacitor C1 has very high impedance at the amplifying signal band. At high-frequency band it has only small interference and noise voltage. Therefore, the high-speed buffer circuit drives a very small current at full frequency range.

EMBODIMENT 2

Figure 6:
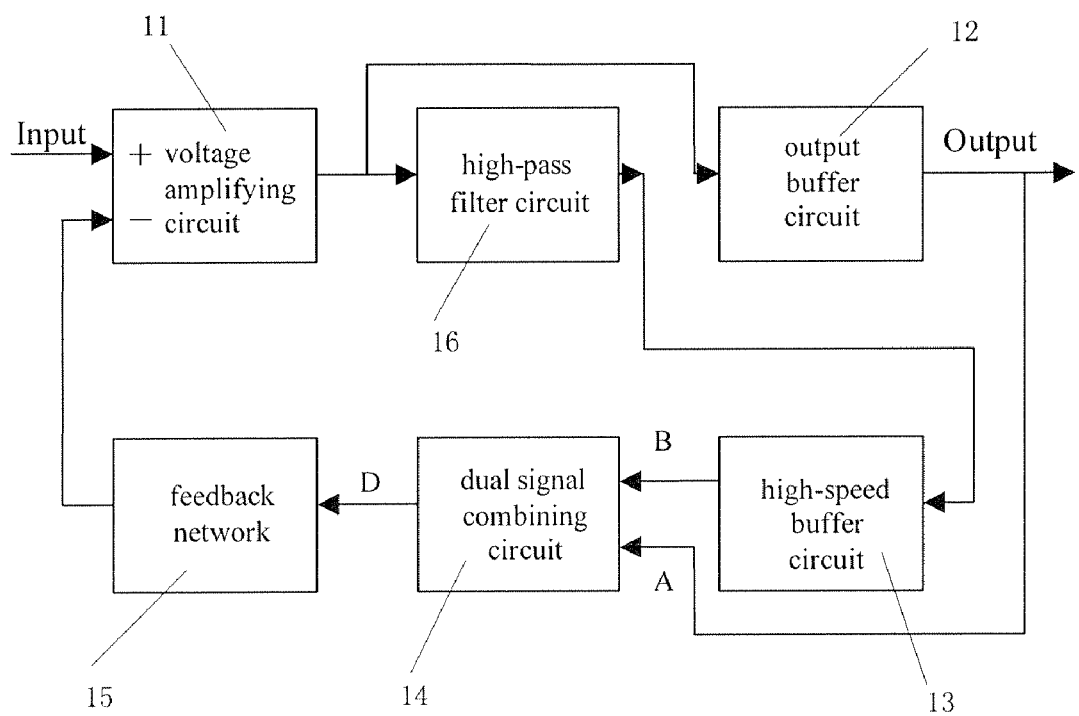
FIG. 6 shows a schematic block illustrating a circuit of a double sampling negative feedback amplifier according to a second embodiment of the invention.

FIG. 6 shows a block illustrating a circuit of a double sampling negative feedback amplifier in accordance with a second embodiment of the invention. Compared with the first example embodiment, the double feedback amplifying circuit further contains a high-pass filter circuit 16 on the high-frequency sampling channel. The high-pass filter circuit 16 is used to remove the signal of the amplifying signal frequency from the high-frequency sampling channel.

Because the high-pass filter circuit 16 is incorporated prior to the high-speed buffer circuit 13 to reduce the amplifying signal at node B, the sampling of the amplifying signal in the high-frequency channel is reduced without stability of the feedback circuit being influenced. In the invention, the high-pass filter circuit 16 can be positioned at either the input or output of the high-speed buffer circuit 13.

After the high-pass filter circuit 16 is incorporated into the high-frequency sampling channel, at the amplifying signal frequency band, a current will pass through the capacitor C1 due to lower voltage level of $V_B$ than that of $V_A$ and $V_D$. It will bring two problems. Firstly, the output current of the high-speed buffer circuit 13 will be increased and accordingly, the drive ability of the current need be extended. Secondly, the bypass effect of the capacitor C1 causes the signal response speed at node D to be less than that at node A. As a result, the response speed of the feedback signal is decreased and the dynamic performance of the amplifying circuit turns to be bad. Considering the above problems, it is necessary to have all things considered when in use.

EMBODIMENT 3

Figure 7:
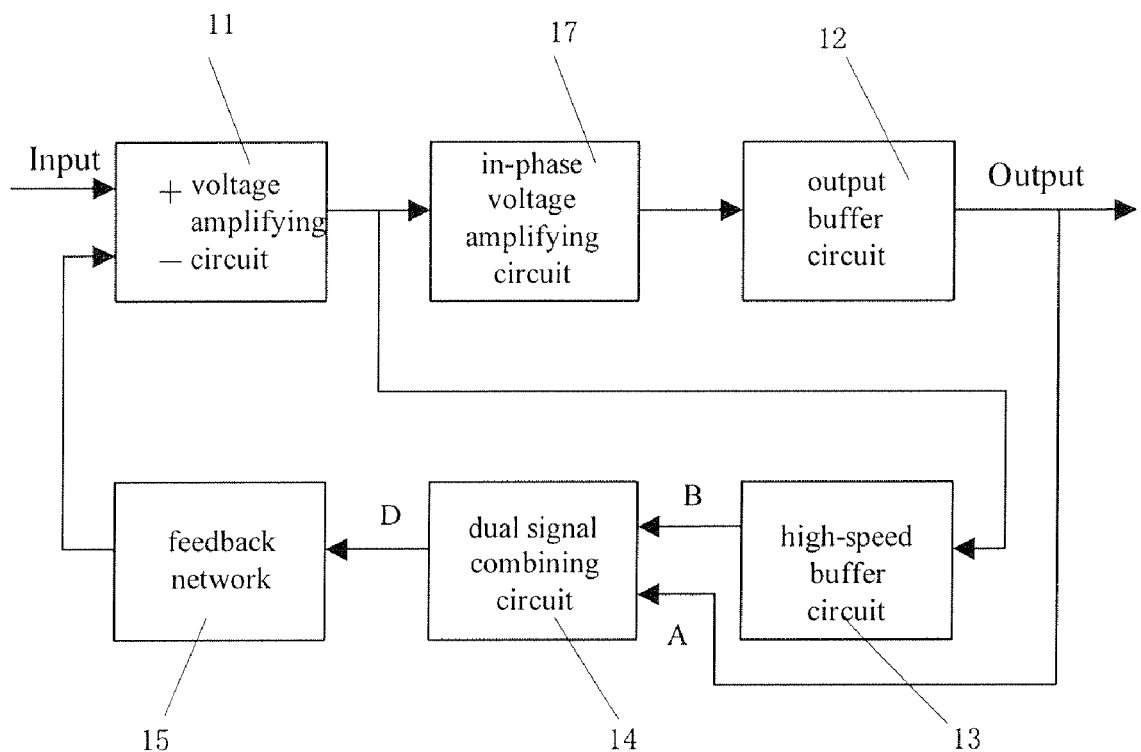
FIG. 7 shows a schematic block illustrating a circuit of a double sampling negative feedback amplifier according to a third embodiment of the invention.

FIG. 7 shows a block illustrating a circuit of a double sampling negative feedback amplifier in accordance with a third embodiment of the invention. Compared with the first example embodiment, a voltage gain stage, i.e., an in-phase voltage amplifying circuit 17, is positioned prior to the output buffer circuit 12. The in-phase voltage amplifying circuit 17 enhances the voltage gain at low-frequency channel such that the DC gain at low-frequency channel is higher than that at high-frequency channel, and as a result, the feedback depth of the amplifying frequency is increased. Because the gain at low-frequency channel is higher than that at high-frequency, at the amplifying signal frequency band, the signal voltage level of $V_B$ is less than $V_A$ and $V_D$. The signal voltage level of $V_B$ is less than $V_A$ at the crossover frequency. It can be known from the expression of Fs that either the capacitor C1 or the inductor L1 should have a larger value. Thus, we can understand that the circuit has the same problem as the circuit shown in FIG. 6. In addition, the response speed of the feedback signal is decreased due to larger value of the capacitor C1 and/or the inductor L1. As a result, the dynamic performance of the amplifying circuit turns to be bad.

Figure 8:
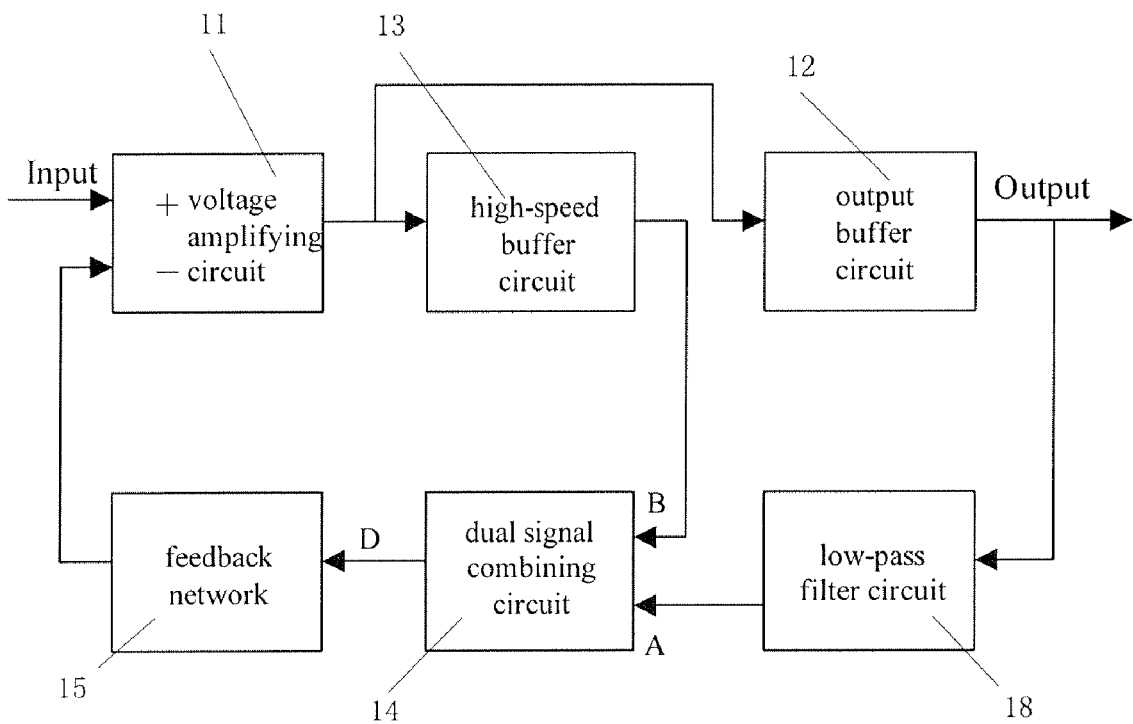
FIG. 8 shows a schematic block illustrating a circuit of a double sampling negative feedback amplifier according to a fourth embodiment of the invention.

FIG. 8 shows a block illustrating a circuit of a double sampling negative feedback amplifier in accordance with another embodiment of the invention. In the embodiment, a low-pass filter circuit 18 is added before the low-frequency sampling channel for removing high-frequency signal from the low-frequency sampling channel. The low pass filtering decreases the response speed of the feedback signal, and thus causes the dynamic performance of the amplifying circuit to turn bad. Notably, the low pass filtering increases the phase-shift in the low-frequency feedback loop, and undue control will influence the stability of the feedback loop.

Figure 9:
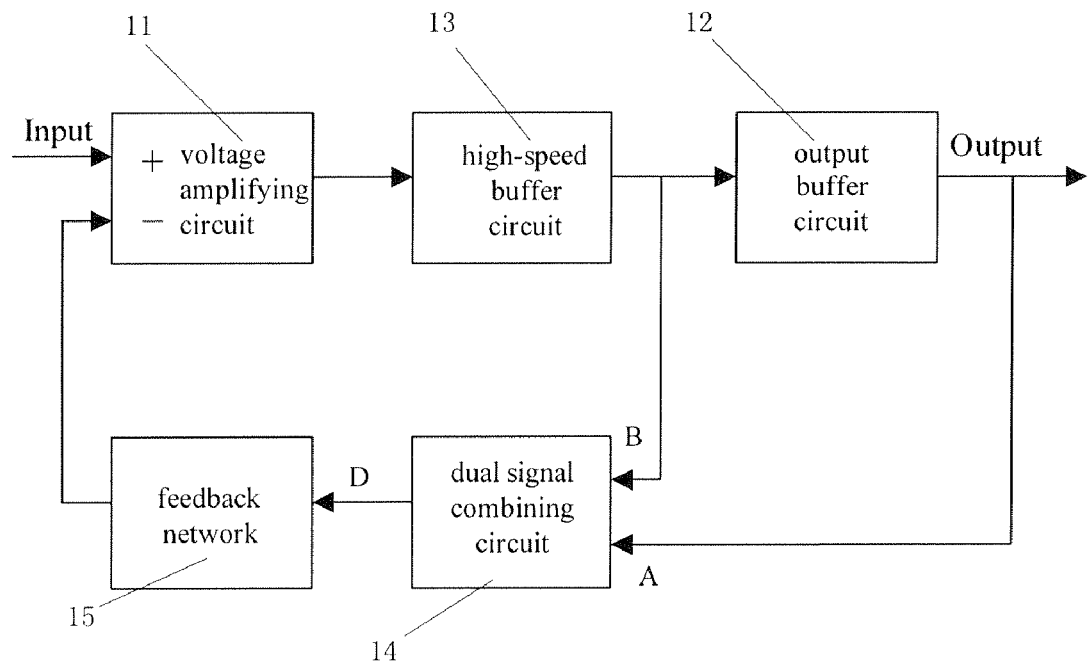
FIG. 9 shows a schematic block illustrating a circuit of a double sampling negative feedback amplifier according to a fifth embodiment of the invention.

FIG. 9 shows a block illustrating a circuit of a double sampling negative feedback amplifier in accordance with a fifth embodiment of the invention. In fact, this embodiment is just a modification of the first example embodiment, and therefore, further details thereof are omitted.

Figure 10:
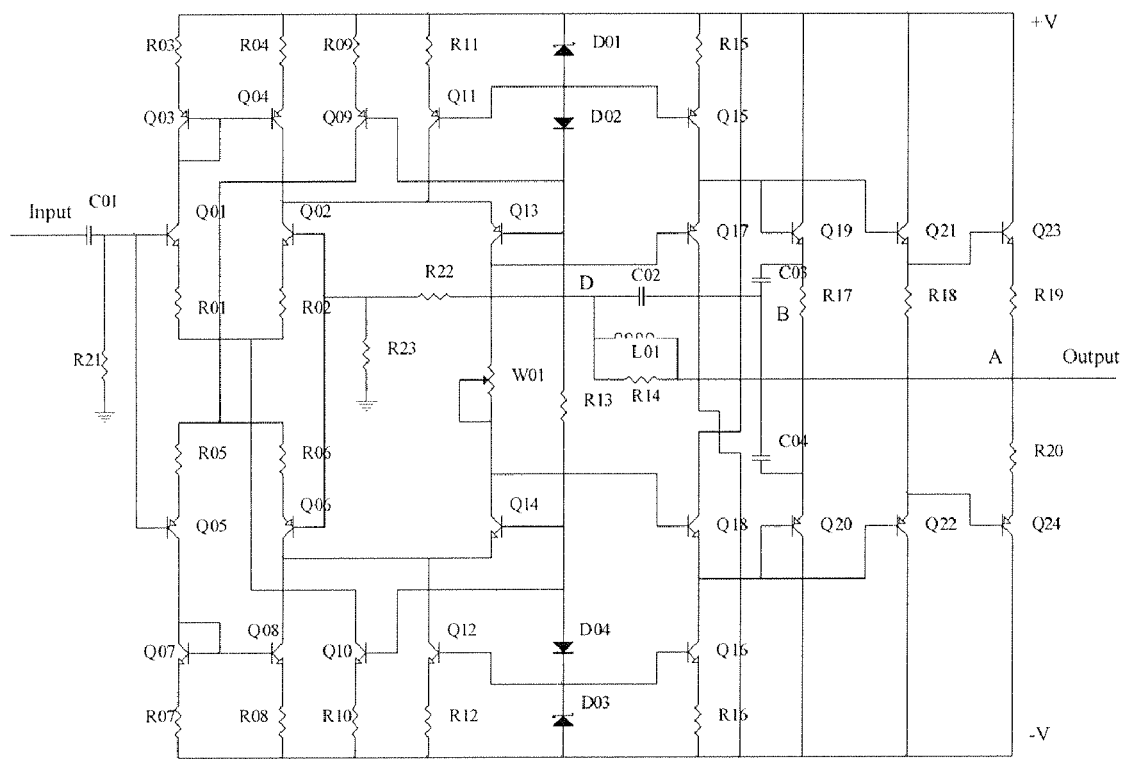
FIG. 10 shows an actual circuit for the double sampling negative feedback amplifier according to an embodiment of the invention.

FIG. 10 shows an actual circuit of the first embodiment of the invention. In the circuit, the voltage amplifying circuit 11 comprises Q01, R01, Q02, R02, Q03, Q04, R04, Q05, R05, Q06, R06, Q07, R07, Q08, R08, Q09, R09, Q10, R10, Q11, R11, Q12, R12, Q13, Q14, Q15, R15, Q16, R16, Q17, Q18, W01, D01, D02, R13, D03, D04, R21. The high-speed buffer circuit 13 comprises Q19, R17, Q20, C03 and C04. The output buffer circuit 12 comprises Q21, R18, Q22, Q23, R19, Q24 and R20. The double signal combining circuit 14 comprises C02, L01 and R14. The feedback network comprises R22 and R23.

The invention confers several advantages. Firstly, as the output buffer circuit thereafter is kept away from the high-frequency feedback loop, the stability at high-frequency will not be influenced by the output buffer circuit (stage) and changeable load. While the output buffer circuit and the load often have great impact on the feedback depth, the stability is only affected at low-frequency. Accordingly, the feedback depth of high-frequency is enhanced, i.e., more stable feedback depth can be obtained. Secondly, because the series capacitor-inductor double signal combining circuit has a feature of rapid frequency change, a relatively narrow bandwidth of the output buffer stage of the amplifier is sufficient to achieve deeper feedback depth, thus reducing difficulty in realizing deep negative loop feedback.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method for double sampling loop negative feedback, comprising the steps of:
    obtaining a low-frequency feedback signal from the output of an amplifier;
    obtaining a high-frequency feedback signal from part of the amplifier of which high-frequency phase shift is low, wherein two-ways sampling signals have the same amplifying phase; and
    combining the two sampling signals using a series capacitor-inductor double signal combining circuit to form one signal, which has low phase shift at both high and low-frequency and is used for negative loop feedback.

2. The method according to claim 1, wherein a damping resistor is added to the capacitor-inductor in series type of double sampling-combining circuit in parallel to the inductor or in series to the capacitor, or a damping resistor is in parallel to the inductor and another resistor is in series to the capacitor.

3. A double sampling negative feedback amplifier, comprising:
    a voltage amplifying circuit used to output voltage signal and transfer it to a high-speed buffer circuit and an output buffer circuit;
    an output buffer circuit used to achieve unit voltage gain, provide amplified output signal and low-frequency feedback sampling signal for a double signal combining circuit;
    a high-speed buffer circuit used to achieve unit voltage gain and output high-frequency feedback sampling signal to a double signal combining circuit;
    a series capacitor-inductor double signal combining circuit used to combine the high and low-frequency feedback signals to form one-way compound feedback signal; and
    a feedback network for transfer the compound feedback signal to an inverting input of the voltage amplifying circuit.

4. The double sampling negative feedback amplifier according to claim 3, wherein the double feedback amplifier has a high-pass filter circuit incorporated in its high-frequency sampling channel in order to remove the signal on the amplifying signal frequency from the high-frequency sampling channel.

5. The double sampling negative feedback amplifier of claim 3, wherein the double sampling negative feedback amplifier further comprises a voltage gain stage prior to the output buffer circuit.

6. The double sampling negative feedback amplifier of claim 3, wherein the double sampling negative feedback amplifier further comprises a low-pass filter circuit prior to the low-frequency sampling node for removing the high-frequency signal from the low-frequency sampling channel.

7. The double sampling negative feedback amplifier of claim 3, wherein a damping resistor may be added to the series capacitor-inductor double signal combining circuit in parallel to the inductor or in series to the capacitor, or a damping resistor may be in parallel to the inductor and another resistor may be in series to the capacitor at a time.

* * * * *